Figure 1:
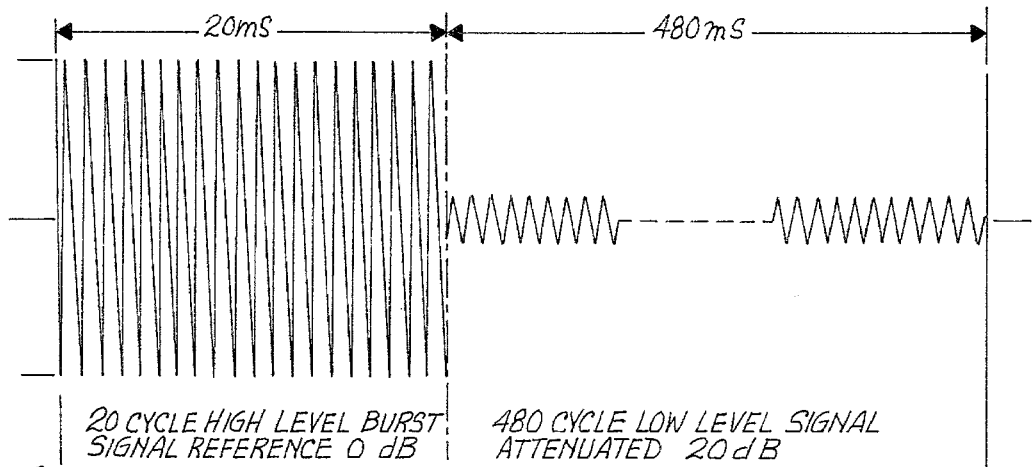

United States Patent [19]

Hoole

[11] 4,336,499

[45] Jun. 22, 1982

[54] DYNAMIC HEADROOM TEST GENERATOR

[75] Inventor: Tyson C. A. Hoole, Bellevue, Wash.

[73] Assignee: The Boeing Company, Seattle, Wash.

[21] Appl. No.: 135,822

[22] Filed: Mar. 31, 1980

[51] Int. Cl.³ .............................................. H03K 4/02
[52] U.S. Cl. .................................. 328/188; 328/178; 331/78
[58] Field of Search ............... 328/118, 123, 187, 188; 307/518, 523; 331/78, 106, 75, 74, 183, 109

[56] References Cited

U.S. PATENT DOCUMENTS

| | | | |
|---|---|---|---|
| 2,773,186 | 12/1956 | Herrmann, Jr. | 331/75 |
| 3,202,834 | 8/1965 | Pingry et al. | 307/518 |
| 3,679,984 | 7/1972 | Buus | 331/74 |

Primary Examiner—David K. Moore
Attorney, Agent, or Firm—Conrad O. Gardner; B. A. Donahue

[57] ABSTRACT

A signal generator for testing the dynamic headroom characteristic of audio amplifiers. The signal generator provides a signal comprising 20 cycles of a 1000 Hz sinewave followed by 480 cycles of a sinewave at the same frequency and having a level of −20 dB relative to the 20 cycle burst. The dynamic headroom test generator signal processing provides a test signal amplitude HI/LO ratio of 10 to 1, and a HI/LO timing ratio not subject to change from 20/500 cycles, whatever audio frequency is utilized.

2 Claims, 2 Drawing Figures

DYNAMIC HEADROOM TEST GENERATOR

The present invention relates to signal generators and more particularly to a signal generator for providing a dynamic headroom test signal.

A new and meaningful test for evaluation of audio amplifiers comprises the dynamic headroom test. The dynamic headroom (I. H. F. Standard) test is a new specification developed by the I. H. F. (Institute of High Fidelity, Inc.). The dynamic headroom test is used to describe an amplifier's short-term power capability. It expresses the ratio of an amplifier's power output for short periods of time to its continuous average power output capability, and is expressed in dB.

In order to make the dynamic headroom test a meaningful audio specification, the I. H. F. has recommended the use of a special test signal. One period of this signal comprises 20 cycles of a 1000 Hz sinewave followed by 480 cycles at a level of −20 dB relative to the 20 cycle burst.

A prior art circuit which can be utilized as a dynamic test signal generator is shown in RADIO ELECTRONICS, Aug. 1971, in an article titled "Fourteen Ways to Use R-E's Tone-Burst Generator" by Tom Annes. FIGS. 4a and 4b of the article show the type of wave forms desired for testing audio amplifiers. The requirements for an I. H. F. dynamic headroom test signal can be met by the R-E tone-burst generator by adjustment of burst width and period controls. The test signal of 1000 Hz is provided by an external source. The timing accuracy of the required test wave form is determined by the critical tolerance values of resistance and capacitance components and by the accurate setting of potentiometers R44 (width) and R63 (period) in the R-E circuit.

Accordingly, it is an object of the present invention to provide a dynamic headroom test signal generator utilizing a digital counter circuit for accurately and automatically providing a 20/480 ratio between burst and gap times whatever frequency is used.

It is a further object of the present invention to provide a dynamic headroom test signal generator circuit which includes a 1000 Hz sinewave oscillator for providing the correct frequency required in the I. H. F. dynamic headroom test for audio amplifiers.

It is yet another object of the present invention to provide a dynamic headroom test signal generator which includes a high, low, and automatic switch in order to provide the operator with a means for selecting continuous sinewave output signals at the burst amplitude, at the gap amplitude (20 dB below the burst amplitude) or at I. H. F. test signal amplitudes.

It is still another object of the present invention to provide a dynamic headroom test signal generator having a gain control and a preset ratio control.

The patent literature it should be noted includes a pulsed 2-tone test signal generator for amplifiers as shown in U.S. Pat. No. 3,679,984. Ratio controlled signal-to-noise generators are illustrated for example by U.S. Pat. No. 2,773,186.

The above-mentioned objects, advantages and features of the present invention will become apparent from the following detailed description taken in conjunction with the drawing in which:

FIG. 1 is a graph showing one period of the dynamic headroom test signal wave form (I. H. F. Standard); and, FIG. 2 is a circuit schematic diagram of the present dynamic headroom test signal generator.

FIG. 1 shows the wave shape of the I. H. F. test signal for dynamic headroom test which is provided at the output terminal 10 of the present test signal generator of FIG. 2.

Figure 2:
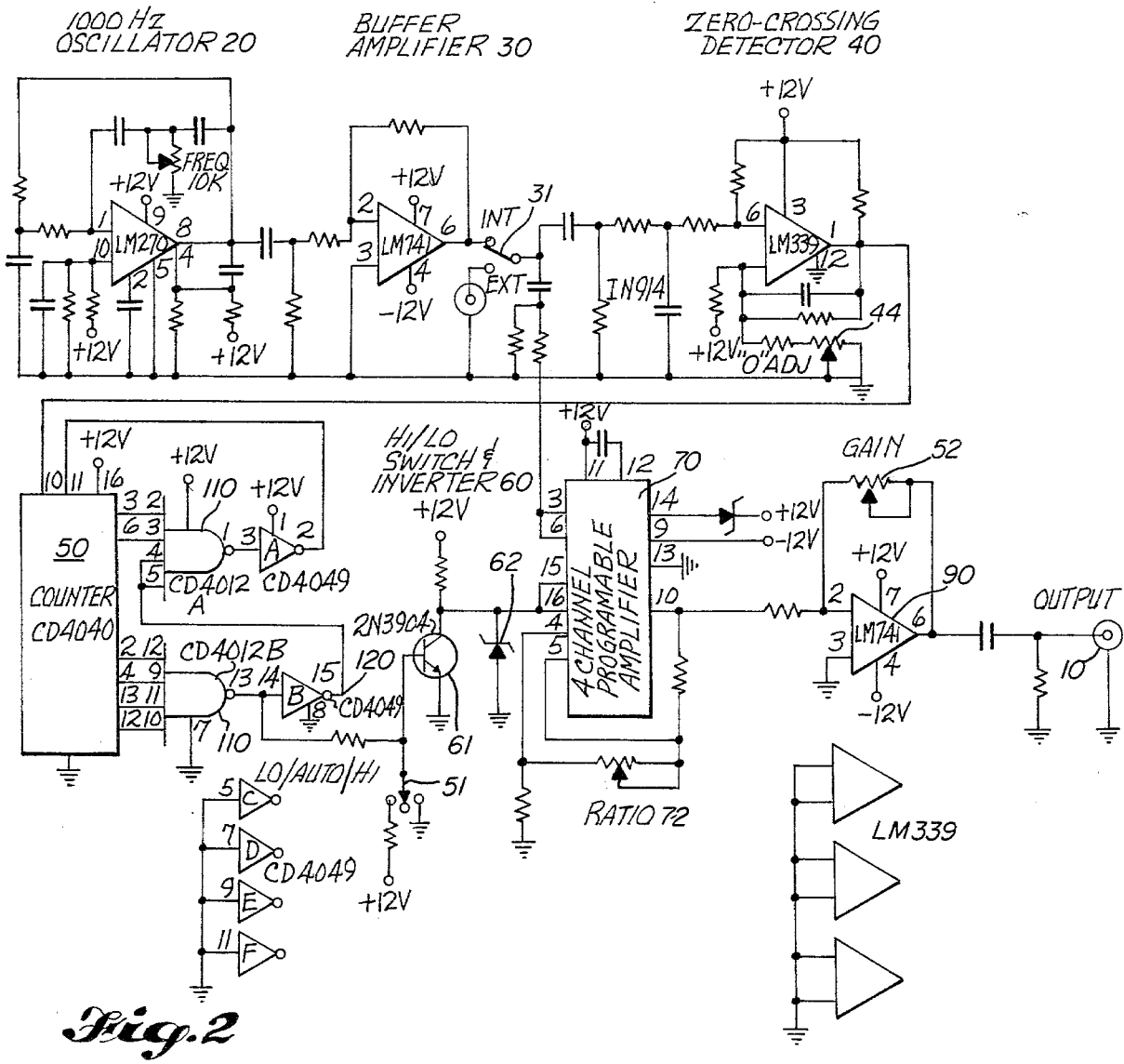

Turning now to FIG. 2 it will be noted that the present dynamic headroom test signal generator includes a 1000 Hz oscillator circuit 20, the system including switching means 31 which permits the use of an external sinewave oscillator source. The circuit of FIG. 2 includes internal signal processing which provides that whatever audio frequency is utilized, the test signal amplitude HI/LO ratio remains at 10-to-1, and the HI/LO timing ratio does not change from 20/500 cycles.

A 3-position switching means 51 permits the operator to select the test signal wave form or a continuous sinewave signal at either the high-level burst amplitude or at the low-level signal amplitude.

Proceeding now to a more detailed description of the circuit operation in FIG. 2 it should be noted that 1000 Hz oscillator circuit 20 incorporates a type LM270 integrated circuit, which is coupled to buffer amplifier circuit 30 comprising an LM741 buffer amplifier. In order to provide a compatible signal level to pins 3 and 6 of 4-channel programmable amplifier 70 (type HA-2405), by buffer amplifier 30 to approximately one-fifth of the output amplitude of oscillator circuit 20.

The output signal of 4-channel PRAM at pin 10 is connected to a second type LM741 amplifier circuit 90 whose gain is controlled by 50K ohm variable-feedback resistor 52. Circuit element 52 may be mounted on the panel (not shown) of the dynamic headroom test signal generator of FIG. 2. The signal output from pin 6 of amplifier 90 is coupled through a 10-microfarad capacitor to output terminal 10.

The HI/LO change in signal amplitude is preset to minus 20 dB, i.e. a ratio of 10:1, by 20K ohm RATIO variable resistor 72 which is connected to pin 4 of HA-2405-5, the 4-channel PRAM. Pins 15 and 16 of 4-channel PRAM 70 are utilized for selection of any one of four operational amplifiers included in PRAM 70, but only two of these amplifiers are utilized in the present circuit. Because they are connected together, pins 15 and 16 must both be in either logic "1" or logic "0" state. When in the logic "1" state, amplifier number 4 is brought into use, and the degree of negative feedback to pin 4 determines its gain. A 10K ohm resistor has been selected for this purpose between pins 10 and 5. Thus, a logic 37 1" to pins 15 and 16 dictates that the output signal at pin 10 is of low amplitude.

A logic "0" to pins 15 and 16 selects amplifier number 1. The feedback and hence its gain is controlled by ratio control 72 hereinbefore mentioned. Thus, a logic "0" dictates that the output is of high amplitude. The HI/LO switching signal to pins 15 and 16 of 4-channel PRAM 70 is derived from counter 50 types CD 4040 and its associated logic circuits.

Output 1000 Hz sinewaves from buffer amplifier circuit 30, or signals from an external source are fed into one-quarter section of LM339 voltage comparator which is utilized in zero-crossing detector circuit 40. A preset control, "0" adjust variable potentiometer 44 provides a means to adjust the duty cycle of the signal appearing at pin 1 of LM339 in zero-crossing detector circuit 40. This square wave signal is coupled to clock CD 4040 of counter 50. Three-quarters of LM339 are not utilized as seen by the connections in the lower right hand side of schematic diagram.

The CD 4012 nand gates 110 and the CD 4049 inverters 120 provide the correct conditions for resetting counter 50 on the 500th clock pulse, the supply a logic "0" pulse for the interval between the 480th pulse and the 500th pulse. HI/LO switch and inverter circuit 60 includes transistor 61 which is a type 1N3904 providing inverting of the pulse and zener diode 62 which is a IN4733 zener diode provides limiting to five volts amplitude prior to amplification to pins 15 and 16 of 4-channel PRAM 70.

L0/AUTO/HI switching means 51 in the base circuit of transistor 61 is a means for providing either a continuous ground or a continuous 5-volts to pins 15 and 16 of 4-channel PRAM 70. This configuration permits either the HI or the LO signal levels to be presented at output terminal 10 as required. The output stage of the dynamic headroom test generator circuit of FIG. 2 which includes amplifier circuit 90 will provide an output HI level over the range of 0 to 7 volts RMS. The output impedance of the circuit of Figure is about 40 ohms.

The following test procedure characterizes the steps necessary for a dynamic headroom calculation:

1. The audio amplifiers being controlled is set at maximum.
2. A continuous 1000 Hz sinewave is applied to the input terminals of the amplifier to be tested.
3. The input signal level is increased until the manufacturers rated continuous average power output is delivered to the rated load impedance.
4. The peak-to-peak output wave form $V_1$ is measured using an oscilloscope.
5. Now, the I. H. F. test signal is applied to the input terminals of the amplifier from the circuit of FIG. 2. The input signal level is adjusted until clipping of the amplified 20 cycle burst signal becomes just apparent.
6. The peak-to-peak output wave form $V_2$ of the burst is measured on the oscilloscope.
7. The amplifiers dynamic headroom is calculated utilizing the following expression:

$$\text{DYNAMIC HEADROOM (dB)} = 20 \log (V_2/V_1)$$

While the above procedure enables calculation of dynamic headroom, the system of FIG. 2 may be utilized for testing loudspeakers by the use of tone-bursts. The acoustic output is compared with the electrical input to verify proper response to transients. The method is particularly useful when testing at low frequencies.

Other applications include use of the system of FIG. 2 as a low-power audio amplifier by employing the EXT input terminal of switch 31 and switching the switching function of switching means 51 to the right or ground position marked HI. A voltage gain of 36 dB is available with an unclipped output of 12 volts peak-to-peak. The frequency response extends from 15 Hz to 11K Hz at the minus 3 dB points relative to the response at 1K Hz.

I claim:
1. A dynamic headroom test signal generator circuit comprising in combination:
   a 1000 Hz oscillator circuit;
   a zero-crossing detector circuit;
   buffer amplifier circuit means coupled between said 1000 Hz oscillator circuit and said zero-crossing detector circuit;
   a counter circuit;
   said zero-crossing detector circuit having a square wave output signal coupled to said counter circuit for clocking said counter circuit;
   a programmable amplifier circuit;
   switching and inverter circuit means coupled between said counter circuit and said programmable amplifier circuit; and,
   an output circuit including an amplifier circuit coupled to said programmable amplifier circuit for providing a dynamic headroom test signal.
2. The invention according to claim 1 including circuit means for resetting said counter circuit on the 500th clock pulse.

* * * * *